(12) United States Patent
Psyk

(10) Patent No.: US 8,187,911 B2
(45) Date of Patent: May 29, 2012

(54) METHOD FOR FORMING THE SEPARATING LINES OF A PHOTOVOLTAIC MODULE WITH SERIES-CONNECTED CELLS

(75) Inventor: Walter Psyk, Munich (DE)

(73) Assignee: SCHOTT Solar AG, Mainz (DE)

( * ) Notice: Subject to any disclaimer, the term of this patent is extended or adjusted under 35 U.S.C. 154(b) by 721 days.

(21) Appl. No.: 12/381,528

(22) Filed: Mar. 12, 2009

(65) Prior Publication Data

US 2009/0231631 A1 Sep. 17, 2009

(30) Foreign Application Priority Data

Mar. 13, 2008 (DE) .................. 10 2008 014 258

(51) Int. Cl.
*H01L 21/00* (2006.01)
(52) U.S. Cl. ...................... 438/80; 257/E21.475
(58) Field of Classification Search ........... 438/68, 438/80; 257/E21.475
See application file for complete search history.

(56) References Cited

U.S. PATENT DOCUMENTS

| | | | | |
|---|---|---|---|---|
| 6,632,993 B2 * | 10/2003 | Hayashi et al. | ............... | 136/256 |
| 8,075,723 B1 * | 12/2011 | Farris, III | .................. | 438/57 |
| 2008/0105295 A1 | 5/2008 | Manz | | |

FOREIGN PATENT DOCUMENTS

| | | |
|---|---|---|
| DE | 10 2006 051 555 A1 | 5/2008 |
| EP | 0 482 240 A1 | 4/1992 |
| WO | WO 2007/144565 A2 | 12/2007 |

* cited by examiner

*Primary Examiner* — Chandra Chaudhari
(74) *Attorney, Agent, or Firm* — Miller Canfield Paddock & Stone PLC; Mark L. Maki

(57) ABSTRACT

For forming the separating lines, (5, 6, 7) which are produced in the functional layers (2, 3, 4) deposited on a transparent substrate (1) during manufacture of a photo-voltaic module with series-connected cells (C1, C2, . . . ), at least one laser scanner (8) is used whose laser beam (14) produces in the field (17) scanned thereby a plurality of separating line sections (18, 18') disposed side by side in the functional layer (2, 3, 4). The laser scanner (8) is moved relative to the coated substrate (1) in the direction (Y) of the separating lines (5, 6, 7), thereby giving rise to an overlap (36) of adjacent fields (17, 17'). At the same time, the laser scanner (8) produces separating line sections (18, 18') which are of hook-shaped configuration at least at one end (32) so as to form a catching area in which the ends (31, 32) of the separating line sections (18, 18') of adjacent fields (17, 17') overlap.

Figure 1:
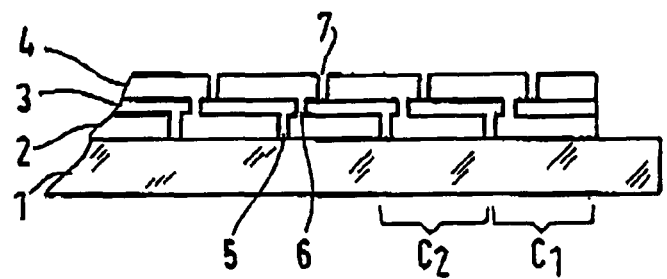

6 Claims, 4 Drawing Sheets

METHOD FOR FORMING THE SEPARATING LINES OF A PHOTOVOLTAIC MODULE WITH SERIES-CONNECTED CELLS

This invention relates to a method according to the preamble of claim 1. Such a method is known from WO 2007/144565 A2. In order for continuous separating lines to result from the separating line sections of adjacent fields, a high precision of calibration of the fields as well as of all components of the patterning apparatus is required.

The separating lines in the particular functional layer are intended to separate adjacent partial areas of said layer electrically from each other. When the separating line sections in one field do not overlap with the separating line sections in the adjacent field due to inaccurate adjustment of the patterning apparatus, for example, gaps form in the (long) separating line composed of the individual separating line sections so that its function becomes faulty and thus the series connection of adjacent cells of the photovoltaic module becomes defective or the individual cells are electrically short-circuited.

From DE 10 2006 051 555 A1 and EP 0 482 240 A1 methods are known wherein separating lines are aligned with separating lines already formed.

It is the object of the invention to ensure an overlap of the separating line sections of adjacent fields.

This is achieved according to the invention by the method characterized in claim 1. The subclaims render advantageous embodiments of the inventive method. According to the invention, the laser scanner produces separating line sections which are of hook-shaped configuration at least at one end so as to form a catching area in which the ends of the separating lines of adjacent fields overlap.

Instead of a straight form of the separating line sections according to the patent application mentioned at the outset, the separating line sections thus deviate from the straight form at least at one end according to the invention. Alternatively, both ends of each separating line section can also be of hook-shaped configuration. The hook-shaped portions can be angled or curved, for example.

Furthermore, the fields overlap in the direction of the separating line according to the invention. To permit the accuracy requirements to be defined in greater tolerances in these overlap zones and also the tolerances to be greater for the whole patterning system, the beginning of each separating line section of one field can for example be executed as a catching area for the previously lasered separating line section of the adjacent field.

When one end of each separating line section is formed as a catching area, i.e. of hook-shaped configuration, according to the invention, this permits errors in the adjustment of the patterning system to be compensated.

The invention thus ensures that the beginning of a separating line section intersects or overlaps the end of the separating line section of the adjacent field.

Preferably, the crest of the hook is located on one side of the straight separating line section and the tip of the hook on the other side thereof in the transverse direction of the separating line. The width of the hook-shaped portion should be at least twice, preferably two to four times, the width of the separating line, and the length of the hook-shaped portion preferably at least half the overlap of the adjacent fields.

Thus, the function of the separating line, namely, electrical separation of the particular functional layer, is ensured without interruption according to the invention. Preferably, the catching areas of the separating lines of all three functional layers are executed in the same form if possible.

The length of the hook-shaped portion should be at least half the overlap of the adjacent fields. Furthermore, the length of the hook-shaped portion is preferably at least three times the width of the separating line.

Thus, a 100 percent overlap of the separating line sections of adjacent fields is ensured at a separating line width of 50 μm and a precision of ±25 μm for example by catching areas or hook-shaped portions having a width of 100 μm and a length of 500 μm.

The special for of the catching areas of the separating line sections enlarges the lost area due to the series connection only very slightly. Considering for example a 1.4 $m^2$ large solar module of 1100×1300 $mm^2$ with 160 solar cells parallel to the 1300 $mm^2$ wide substrate and a 250 μm wide series connection with 50 μm wide separating lines with an interval of 100 μm, a length of the separating line sections per field of 150 mm, 500 μm long and 100 μm wide catching areas and 8 catching areas per 1300 mm long separating line, then the lost area per series connection is enlarged by only approx. 0.11%. This area loss can be neglected upon an overall view of a photovoltaic module.

Figure 2:
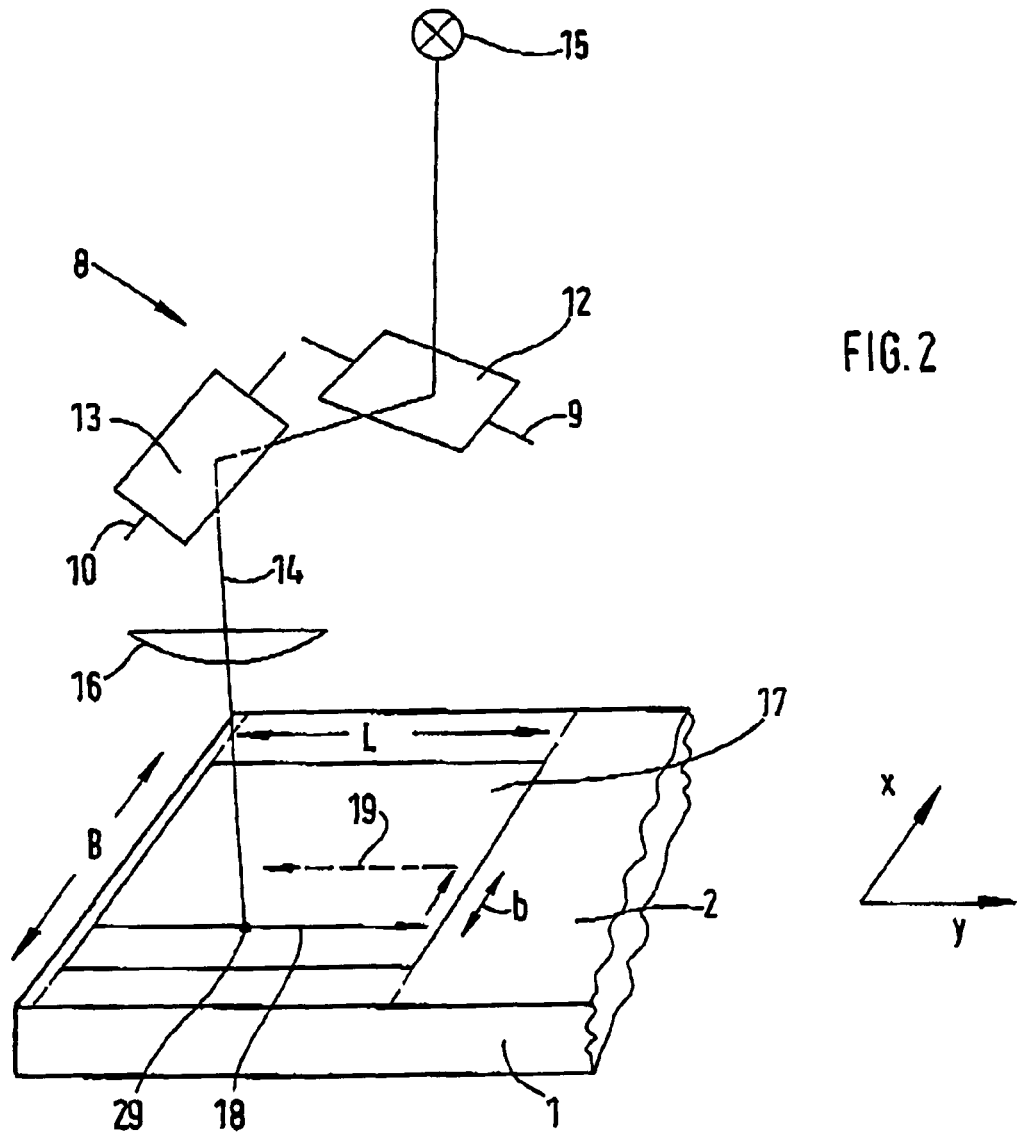
Figure 3:
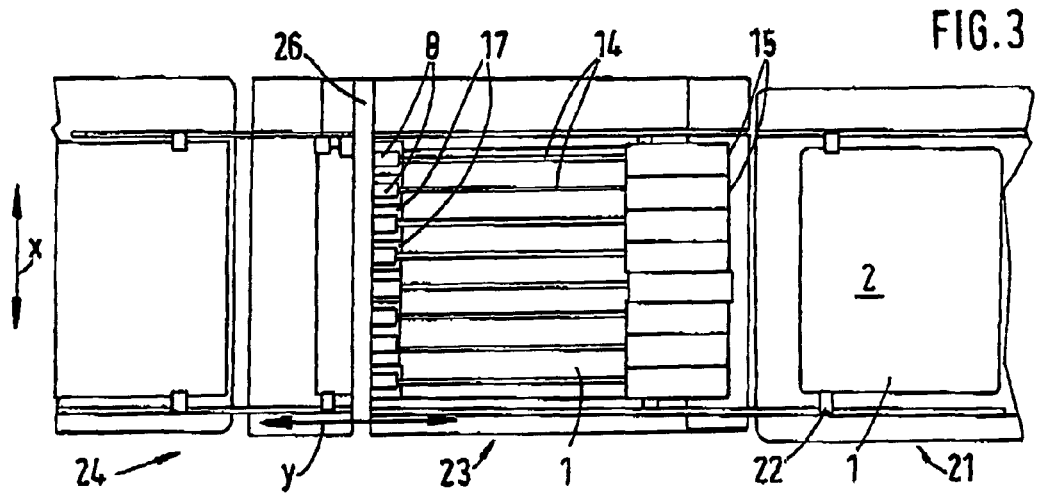
Figure 4:
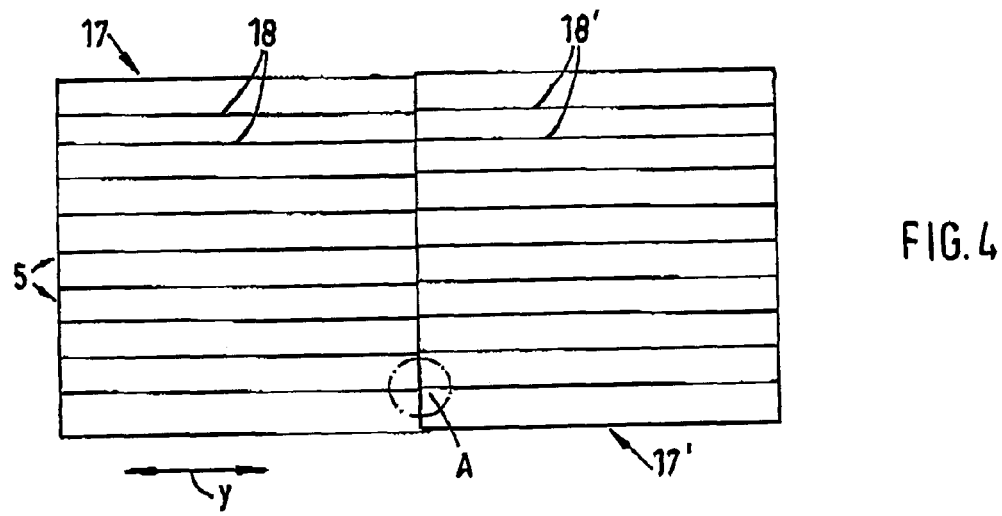
Figure 5:
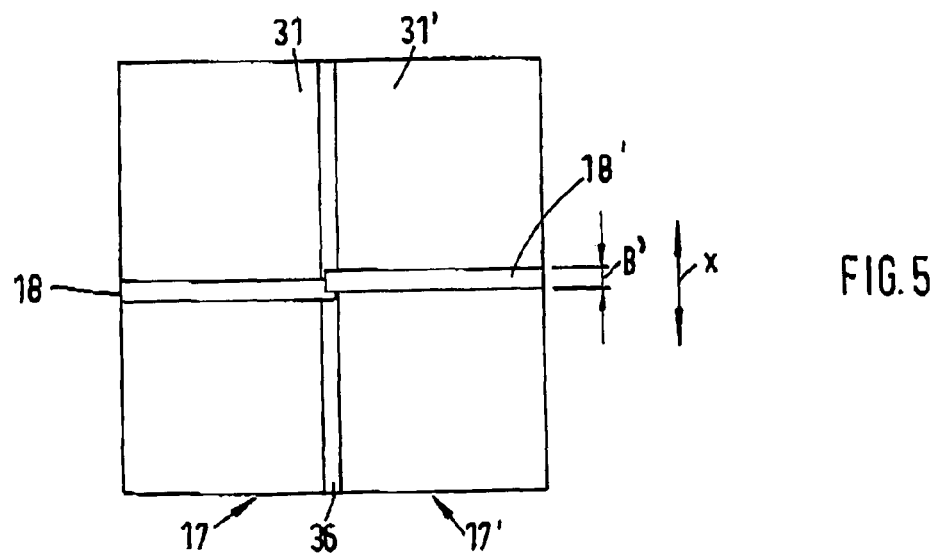
Figure 6:
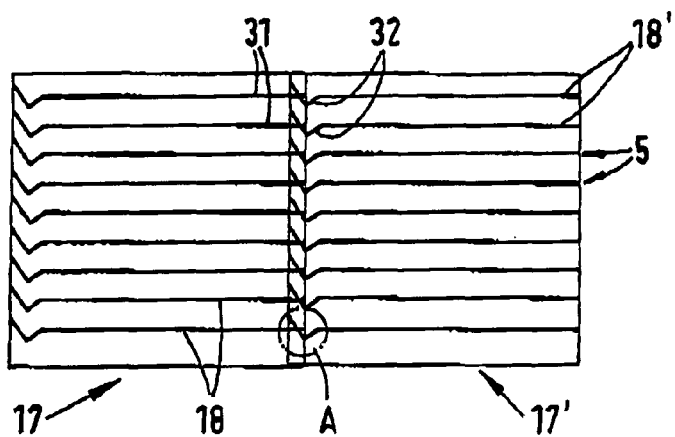
Figure 7:
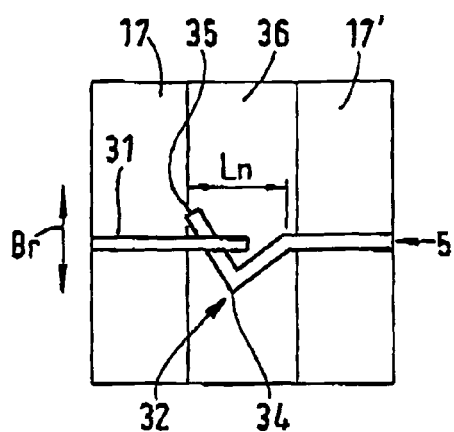
Figure 8:
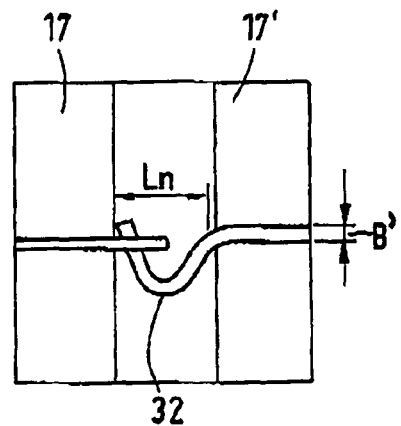
Figure 9:
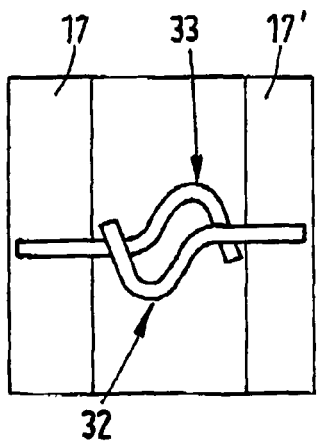
Figure 10:
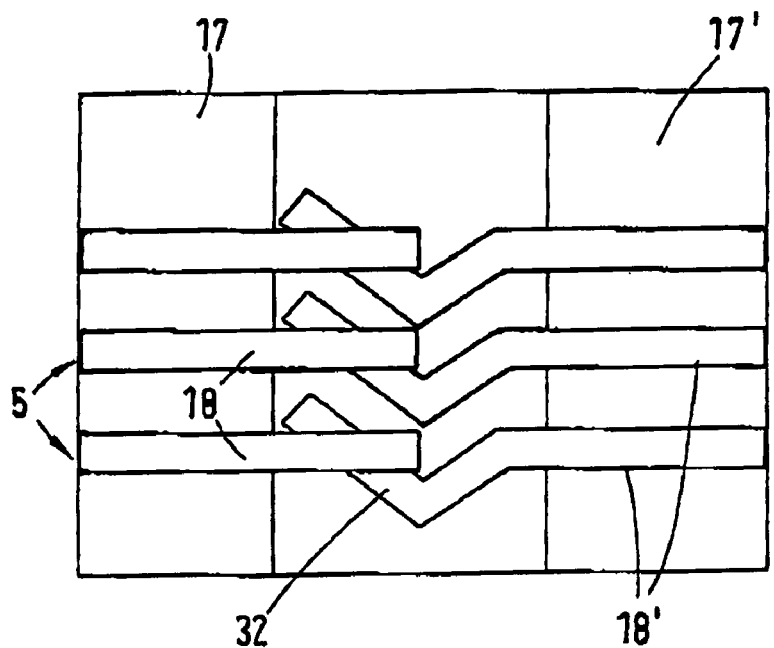
Figure 11:
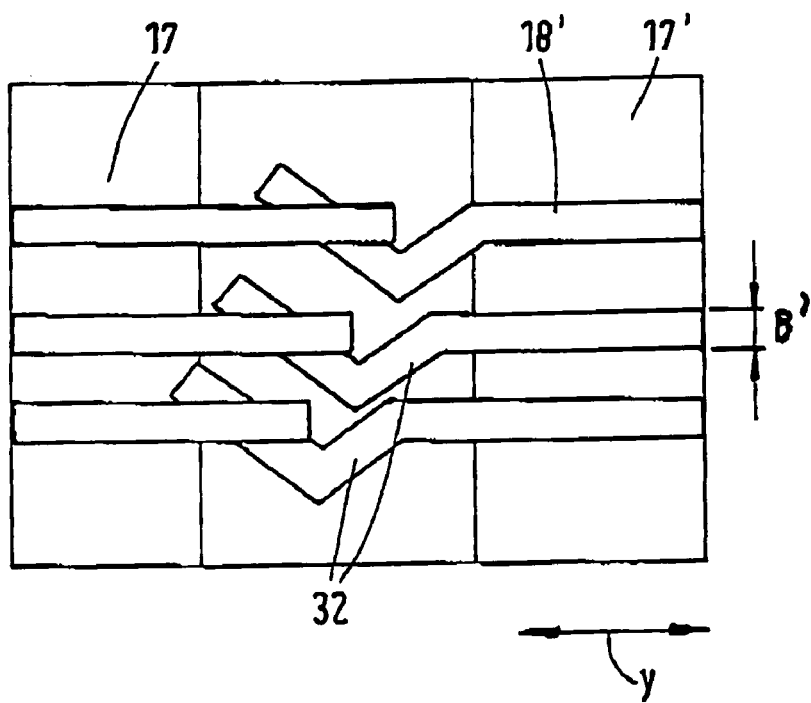

Hereinafter the invention will be explained more closely by way of example with reference to the enclosed drawing. Therein is shown schematically:

FIG. 1 a section through a part of a photovoltaic module substrate provided with series-connected cells, the functional layers being shown greatly enlarged;

FIG. 2 a perspective view of a laser scanner and of a part of the coated substrate;

FIG. 3 the front view of a plant for producing the separating lines in a functional layer of the substrate;

FIG. 4 a plan view of two fields disposed side by side in the Y direction with separating line sections produced according to the patent application mentioned at the outset;

FIG. 5 an enlarged representation of the area A in FIG. 4;

FIG. 6 a plan view of two adjacent fields corresponding to FIG. 4 but with separating line sections in one field which are inventively configured at their beginning;

FIG. 7 an enlarged representation of the area A in FIG. 6;

FIGS. 8 and 9 a representation corresponding to FIG. 7 but of separating line section ends inventively configured in another embodiment in each case;

FIG. 10 a plan view of symmetrically overlapping ends of adjacent separating line sections; and FIG. 11 a plan view of offset overlapping ends of adjacent separating line sections.

According to FIG. 1, a transparent substrate 1, for example a glass plate, has a transparent front electrode layer 2, a semiconductor layer 3 and a back electrode layer 4.

The functional layers 2, 3 and 4 are provided with separating lines 5, 6, 7 to form series-connected strip-shaped cells C1, C2, . . . .

The separating lines 5, 6, 7 are produced with laser scanners 8.

According to FIG. 2, the laser scanner 8 has two mirrors 12, 13 rotatable around the orthogonal axes 9, 10 for reflecting the laser beam 14 from the laser source 15 to a focusing optic 16 for focusing the laser beam 14 on the functional layer, for example the front electrode layer 2.

As shown in FIG. 2, the laser beam 14 of each laser scanner 8 scans a focusing surface or field 17 e.g. with a length L of 150 mm and a width B of 150 mm on the functional layer 2 which is to be provided with the separating lines 5 extending in the Y direction (FIG. 3).

For this purpose, the laser scanner 8 is provided with the two mirrors 12, 13 operable in each case by a galvanometer drive (not shown).

To produce in the field 17 a line, i.e. a section 18 (FIG. 2) of a separating line 5, the mirror 12 is rotated and thereby the laser beam 14 deflected in the Y direction.

After producing in the field 17 the separating line section 18 extending over the total length L of the field 17 in FIG. 2, the laser beam 14 must be guided onto the next line 19 shown by a dashed line in FIG. 2 in order to produce the next parallel separating line section in the field 17.

For this purpose, the mirror 13 is first rotated and thus the laser beam 14 guided in the X direction perpendicular to the Y direction by the distance b which corresponds to the distance between two adjacent separating lines 5 in the functional layer 2. The mirror 12 is then operated again, thereby forming in the line 19 the next separating line section extending over the total length of the field 18. This process is repeated until the field 17 is provided with separating line sections 18 across its total width B.

According to FIG. 3, a plant for forming the separating lines 5, 6, 7 has a loading station 21 on which the substrate 1 coated for example with the front electrode layer 2 is fixed on end, optionally also obliquely, with a receiving means 22 formed by a clamping device.

From the loading station 21 the substrate 1 is moved in the Y direction to the processing station 23 where the separating lines 5 are produced in the layer 2, and from there to the unloading station 24 on the other side of the processing station 23.

The processing station 23 has eight laser scanners 8 each with one laser source 15. The eight laser scanners 8 are disposed on a holder 26 configured as a gantry and thus extend in a row transversely, i.e. in the X direction, across the substrate 1 to be processed whose layer 2 is to be provided with the separating lines 5.

Each laser scanner 8 according to FIG. 3 is constructed substantially as described in connection with FIG. 2. That means that all eight laser scanners 8 simultaneously provide the field 17 located therebelow with separating line sections 18 extending over the total length L of each field 17. The individual fields 17 under the laser scanners 8 adjoin each other in the Y direction. Thus, the substrate 1 is provided across its total width with parallel separating line sections 18 disposed in a row which have a length L corresponding to the fields 17.

In the next step, the laser scanners 8 must be moved relative to the substrate 1 in the Y direction, by a distance corresponding at the most to the length L of the fields 17.

Then the laser scanners 8 form a second row of parallel separating line sections 18 extending across the total width of the substrate 1. This process is repeated until the separating line sections 18 of the individual rows form in the layer 2 continuous separating lines 5 extending in the Y direction over the total length of the substrate 1.

It should be noted that the distance by which the laser scanners 8 are moved in the Y direction upon each step is somewhat smaller than the length of the fields 17 in order to obtain an overlap of the fields 17 in the Y direction. In order for continuous separating lines to be formed, it is further required that the individual separating line sections 18 of each separating line 5 are flush with each other.

This is shown more closely in FIGS. 4 and 5. FIG. 4 shows two fields 17, 17' adjoining each other in the Y direction, with the separating lines 5 which are formed by the separating line sections 18, 18' of adjacent fields 17, 17'.

If the width B' of the separating lines is e.g. 50 μm, a precision of ±25 μm in the X direction must be maintained, as well as an overlap 36, in order to form continuous separating lines 18, 18'.

According to FIGS. 4 and 5, exact tolerances must thus be maintained in order for the ends 31, 31' of the separating line sections 18, 18' to overlap. This requires an extremely precise adjustment of the patterning apparatus 23.

In contrast, according to the invention, as to be seen in FIGS. 6 to 8, the hook-shaped end areas 32 of the separating line sections 18' of one field 17' of the two overlapping fields 17, 17' form catching areas which ensure an overlap with the straight end area 31 of the separating line sections 18 of the adjacent field 17.

The hook-shaped end areas 32 are of angled configuration according to FIGS. 6 and 7, while they are wavy or curved according to FIG. 8.

While only the end areas 32 of the separating line sections 18' of one field 17' are of hook-shaped configuration in the embodiment according to FIGS. 6 to 8, both mutually overlapping end areas 32, 33 are of hook-shaped configuration in the embodiment according to FIG. 9.

According to FIG. 10 the hook-shaped end areas 32 of adjacent separating line sections 18' are configured parallel and thus symmetrically, while according to FIG. 11 they are disposed offset in the Y direction.

As evident from FIG. 7, the crest 34 of the hook-shaped end area 32 is disposed on one side of the separating lines 5 and the hook tip 35 on the other side thereof.

The hook-shaped end area 32 has a width Br and a length Ln according to FIG. 7. The length Ln corresponds substantially to the overlap 36 of the two fields 17, 17' or approximately to 5 times the width B of the separating lines 5.

Thus, the processing time for forming the separating lines 5, 6, 7 can be reduced by more than 70% at low additional cost for equipment.

Patterning has been explained hereinabove in the Y direction, i.e. in the longitudinal direction of the rectangular substrate 1. However, separating lines and thus separating line sections can also extend in the X direction, e.g. across the total width of the coated substrate. For this purpose, the laser scanners 8 form in one step continuous separating lines extending across the total width, i.e. length of the substrate 1 in the X direction. Then there is effected a relative motion of the laser scanners 8 and of the substrate 1 in the Y direction by at the most a distance corresponding to the length L of the fields 17, whereupon the laser scanners 8 again form continuous separating lines extending across the total width of the functional layer of the substrate 1, etc.

It should also be noted that the substrate on which the functional layers are deposited can also be opaque, i.e. not transparent. This means that it can form a back cover of the module, on which the back electrode layer, the semiconductor layer and then the transparent front electrode layer are deposited, and then a transparent plate or foil applied to the front electrode layer.

The invention claimed is:

1. A method for forming separating lines (5, 6, 7) wherein the separating lines (5, 6, 7) which are produced in the transparent front electrode layer (2), the semiconductor layer (3) and/or the back electrode layer (4), deposited as functional layers on a substrate (1) with at least one laser scanner (8) during manufacture of a photovoltaic module with series-connected cells (C1, C2, . . . ), the laser beam (14) of the laser scanner (8) producing in the field (17, 17') scanned thereby a plurality of separating line sections (18, 18') disposed side by side in the functional layer (2, 3, 4), whereby the laser scanner (8), after scanning the field (17), is moved relative to the coated substrate (1) by a distance which leads to the overlap (36) of a further field (17') with the scanned field (17) in the direction of the separating lines (5), characterized in that the laser scanner (8) produces separating line sections (18, 18') which are of hook-shaped configuration at least at one end (32, 33) so as to form a catching area in which the ends (31, 32, 33) of the separating line sections (18, 18') of adjacent fields (17, 17') overlap.

2. The method according to claim 1, characterized in that the hook-shaped end areas (32, 33) are of angled or curved configuration.

3. The method according to claim 1 or 2, characterized in that the crest (34) of the hook-shaped end (32, 33) is located on one side of the straight portion of the separating lines (5) and the hook tip (35) on the other side thereof in the transverse direction (X) of the separating lines (5).

4. The method according to any of the above claims, characterized in that the width (Br) of the hook-shaped end area (32, 33) is at least twice the width (b) of the separating lines (5).

5. The method according to any of the above claims, characterized in that the length (Ln) of the hook-shaped end area (32, 33) is at least half the overlap (36) of the adjacent fields (17, 17').

6. The method according to any of the above claims, characterized in that the length (Ln) of the hook-shaped end area (32) is at least three times the width (b) of the separating lines (5).

* * * * *